United States Patent
Haberstroh et al.

(10) Patent No.: US 11,431,323 B2
(45) Date of Patent: Aug. 30, 2022

(54) SIGNAL ACQUISITION CIRCUIT, A SINGLE-HOUSED DEVICE AS WELL AS METHOD OF ACQUIRING DATA OF AN INPUT SIGNAL

(71) Applicant: Rohde & Schwarz GmbH & Co. KG, Munich (DE)

(72) Inventors: Felix Haberstroh, Munich (DE); Nico Toender, Munich (DE); Julian Zinsser, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/661,791

(22) Filed: Oct. 23, 2019

(65) Prior Publication Data

US 2020/0412342 A1    Dec. 31, 2020

Related U.S. Application Data

(63) Continuation-in-part of application No. 16/457,547, filed on Jun. 28, 2019, now Pat. No. 11,137,428.

(51) Int. Cl.
*H03H 17/06* (2006.01)
*H03H 17/02* (2006.01)

(52) U.S. Cl.
CPC .... *H03H 17/0621* (2013.01); *H03H 17/0292* (2013.01)

(58) Field of Classification Search
None
See application file for complete search history.

(56) References Cited

U.S. PATENT DOCUMENTS

| | | | |
|---|---|---|---|
| 2004/0117143 A1* | 6/2004 | Tran | G01R 13/0254 702/121 |
| 2004/0128076 A1* | 7/2004 | Pupalaikis | G01R 19/2509 702/16 |
| 2006/0080065 A1* | 4/2006 | Pupalaikis | G01R 13/0272 702/189 |
| 2012/0310601 A1* | 12/2012 | Martin | H03H 17/0621 702/190 |
| 2013/0060527 A1* | 3/2013 | Martin | G01R 13/0254 702/189 |
| 2017/0254835 A1* | 9/2017 | Montijo | G01R 13/0254 |

* cited by examiner

*Primary Examiner* — Nasima Monsur
(74) *Attorney, Agent, or Firm* — Christensen O'Connor Johnson Kindness PLLC

(57) ABSTRACT

A signal acquisition circuit for acquiring data of an input signal comprising at least n acquisition units, wherein n is integer greater than one, the n acquisition units comprising k inputs, wherein k is integer greater than one, and wherein at least two inputs are assigned to one channel and the corresponding acquisition units run time interleaved, and at least one trigger unit, wherein the number 1 of the at least one trigger unit is integer and wherein 1 is smaller than k. Further, a single-housed device as well as a method of acquiring data of an input signal are described.

15 Claims, 2 Drawing Sheets

SIGNAL ACQUISITION CIRCUIT, A SINGLE-HOUSED DEVICE AS WELL AS METHOD OF ACQUIRING DATA OF AN INPUT SIGNAL

CROSS-REFERENCE TO RELATED APPLICATION

This application is a continuation-in-part of U.S. patent application Ser. No. 16/457,547, filed Jun. 28, 2019, the disclosure of which is incorporated by reference herein.

FIELD OF THE DISCLOSURE

Embodiments of the present disclosure relate generally to a signal acquisition circuit for acquiring data of an input signal, particularly a high bandwidth input signal. Further, embodiments of the present disclosure relate generally to a single-housed device as well as a method of acquiring data of an input signal, particularly a high bandwidth input signal.

BACKGROUND

In measurement devices such as oscilloscopes or spectrum analyzers, an input signal is sampled in order to obtain sampled values of the input signal, which are digitized, quantized and acquired. Then, the input signal can be reconstructed as an image, also called trace, on a display of the measurement device by reading and processing the acquired values.

Generally, the acquired values and the trace related thereto is displayed only in parts, as only those portions are displayed that are in a defined relationship to a detected event in the input signal, for instance a rising edge or a falling edge of the input signal. The detected event is also called trigger event or just trigger. When the trigger event detected is a condition of the input signal itself, the event is called internal trigger event. When the trigger event detected is a condition outside of the input signal that has relationship to the input signal measured, such as another signal, the event is called external trigger event. However, a subset of the acquired data, namely the acquired values, is displayed in response to a detected trigger in order to allow zooming of the trace.

The respective triggering is done by a trigger unit that has to be operated in real-time, as it cannot process already acquired data during an offline post-processing.

If, however, the data rate of the input signal exceeds the sampling or rather acquisition rate of an acquisition system operated in real-time, more than one acquisition unit is operated in parallel in order to process the input signal in real time.

In US 2017/0254835 A1, such a measurement system is shown that comprises several sub-channels assigned to several acquisition units operated in parallel, wherein an input signal is processed by the several sub-channels in an interleaved manner in order to enable the measurement system to operate at the full signal bandwidth. Each of the sub-channels comprises its own trigger processor that is configured to perform a trigger detection on the respective interleaved input signal processed by the respective sub-channel Hence, each trigger processor takes the corresponding interleaved input signal into account, which is processed by the associated sub-channel.

However, each of the respective trigger processors only process the under-sampled interleaved input signal assigned to the respective sub-channel such that triggering is done with respect to the individual interleaved input signals. Put differently, the measurement system is not able to consider the entire bandwidth of the input signal with respect to triggering, particularly complex trigger scenarios cannot be applied in a sufficient manner.

Accordingly, there is a need for a possibility to trigger on an input signal without any limitation concerning the bandwidth.

SUMMARY

Embodiments of the present disclosure provide a signal acquisition circuit for acquiring data of an input signal. In an embodiment, the signal acquisition circuit comprises at least n acquisition units, wherein n is integer greater than one. The n acquisition units comprise k inputs, wherein k is integer greater than one. At least two inputs are assigned to one channel and the corresponding acquisition units run time interleaved. In some embodiments, the signal acquisition circuit further comprises at least one trigger unit, wherein the number 1 of the at least one trigger unit is integer and wherein 1 is smaller than k.

Further, embodiments of the present disclosure provide a method of acquiring data of an input signal, comprising the following steps:

receiving the input signal via a channel;
interleaving the input signal into interleaved input signals;
forwarding the interleaved input signals to inputs of acquisition units that run time interleaved; and
forwarding a first interleaved input signal from a first acquisition unit to a trigger unit assigned to a second acquisition unit.

Accordingly, the signal acquisition circuit as well as the method of acquiring data of an input signal ensure that triggers or rather trigger scenarios can be applied on the input signal without any limitation concerning the bandwidth of the input signal such that the signal acquisition circuit is enabled to process the respective data stream in its entirety. For example, several acquisition units are operated in parallel wherein the number of trigger units used by the signal acquisition circuit is lower than the number of inputs of the acquisition units and/or the number of acquisition units.

In other words, at least one of the interleaved input signals is forwarded from one of the several acquisition units to another acquisition unit. The respective interleaved input signal was processed by the respective acquisition unit prior to being forwarded to the other acquisition unit.

Hence, the acquisition units do not necessarily have to have an own trigger unit, as they may share a common trigger unit. This allows to trigger on signals with a large bandwidth in real-time even though the data rate of the input signal is higher than the processing rate, namely the sampling or rather acquisition rate, of an individual acquisition unit.

The signal acquisition circuit as well as the method according to the present disclosure ensure that no limitation concerning the bandwidth of the input signal takes place.

Furthermore, the functionality of the trigger unit of the signal acquisition circuit corresponds to the one of a non-interleaved system even though the signal acquisition circuit relates to an interleaved acquisition system, as at least two acquisition units run time interleaved. Moreover, none of the edges in the input signal are discarded for triggering purposes in contrast to systems known in the prior art, for instance the signal acquisition known from U.S. 2017/0254835 A1.

Accordingly, complex trigger scenarios are possible. For example, several (different) thresholds may be applied on the input signal processed by the signal acquisition circuit. Put differently, complex trigger scenarios may be applied.

In other words, the signal acquisition circuit according to the present disclosure allows to trigger on the input signal without any band limitation while simultaneously not discarding any signal edges in the input signal. The respective data processed by one of the acquisition units is forwarded or rather transferred to another (subsequent) acquisition unit, for example at a suitable point in the acquisition and in a suitable format. The respective data exchanged corresponds to the interleaved input signal processed by the first acquisition unit, which can be processed by the respective trigger unit that may be assigned to the other acquisition unit, namely the second acquisition unit.

In other words, an interleaved input signal processed by one of the acquisition units is exchanged among at least two of the acquisition units, for example forwarded to the trigger unit assigned to one of the acquisition units. Hence, the sampling or rather processing rate of the signal acquisition circuit is increased. Accordingly, a single trigger unit is configured to trigger (interleaved) input signals processed by at least two different acquisition units.

Generally, the input signal may relate to a PAN-n signal.

According to an aspect, each of the n acquisition units has at least one input. Thus, each of the acquisition units is configured to process at least one interleaved input signal.

In general, k interleaved input signals are processed by the signal acquisition circuit comprising k inputs assigned to the n acquisition units.

A single acquisition unit may comprise more than one input, for instance at least two inputs. Thus, the number of acquisition units n may be different to the number of inputs k.

Another aspect provides that each of the n acquisition units has at least two inputs that are assigned to different channels of the signal acquisition circuit. Each channel is assigned to a signal input via which a respective input signal is received and forwarded to the signal acquisition circuit, for example to the respective acquisition units, for instance in an interleaved manner. Since each acquisition unit of the n acquisition units has at least two different inputs assigned to different channels, each of the acquisition units is assigned to at least two different signal inputs. Therefore, the signal acquisition circuit may be assigned to signal inputs for different bandwidths, for instance bandwidths up to 32 GHz, 64 GHz or rather 128 GHz.

Furthermore, each channel may have a maximum sampling rate SR_k. The maximum sampling rate SR_k divided by the number of inputs k is constant. Thus, the channel enabled to process signals with a bandwidth up to 64 GHz comprises k=2 inputs and a maximum sampling rate SR_k=160 GSamples/s, whereas the channel enabled to process signals with a bandwidth up to 128 GHz comprises k=4 inputs and a maximum sampling rate SR_k=320 GSamples/s.

Another aspect provides that the signal acquisition circuit further comprises a signal bus connecting each of the n acquisition units with the at least one trigger unit. Hence, the first interleaved input signal is forwarded to the trigger unit via a signal bus connecting each of the acquisition units with the trigger unit. Depending on the number of acquisition units, more than one interleaved signal previously processed by the respective acquisition unit is forwarded to the respective trigger unit via the signal bus. Hence, two or more different interleaved signal previously processed by the respective acquisition units are forwarded to the respective trigger unit via the signal bus.

For instance, at least one of the n acquisition units comprises a quantizer configured to quantize a k-th input signal and to output a quantized input signal. Hence, at least one of the acquisition units comprises a quantizer that quantizes at least one of the interleaved input signals and outputs a quantized input signal. Generally, the quantization reduces the data rate in order to cope with the respective physical data interface limitations.

Hence, the respective acquisition unit relates to an acquisition and quantization unit.

In some embodiments, at least one of the n acquisition units comprises a quantizer configured to quantize a k-th input signal and to output a quantized input signal, wherein the signal bus communicates the quantized input signal.

The quantized input signal outputted by the respective acquisition unit may be forwarded to the at least one trigger unit.

The respective interleaved input signal processed by the respective acquisition and quantization unit corresponds to a quantized (interleaved) input signal that is forwarded to the at least one trigger unit via the signal bus.

Accordingly, the quantized (interleaved) input signal is exchanged instead of simple information about a trigger index that does not exist, as no trigger has yet been applied on the processed interleaved input signal exchanged, namely the quantized (interleaved) input signal.

Put differently, the data exchange between the different acquisition units and the at least one trigger unit is realized by the signal bus.

In general, the interleaved input signal processed by one of the acquisition units relates to the k-th input signal depending on the respective input.

Further, the signal acquisition circuit may comprise at least one filter. Hence, at least one of the interleaved signals is filtered prior to being forwarded. The at least one filter may be configured to filter the k-th input signal. Thus, the (quantized) interleaved input signal may be filtered prior to being forwarded (via the signal bus) to the at least one trigger unit such that a pre-filtered (quantized) interleaved input signal is forwarded to the at least one trigger unit (via the signal bus).

A band pass filter, a low pass filter and/or an equalizer may establish the at least one filter.

The at least one filter may be provided in one of the n acquisition units. For instance, the filter is provided in the respective acquisition unit that also comprises the quantizer. Hence, the quantized interleaved input signal processed by the respective acquisition unit is also filtered before the respective signal is communicated via the signal bus towards the at least one trigger unit.

According to an embodiment, the signal acquisition circuit has two acquisition units and one trigger unit, wherein two inputs are provided. In other words, n=2 acquisition units, k=2 inputs as well as l=1 trigger unit are provided that form the signal acquisition circuit. This signal acquisition circuit ensures to process input signals with a bandwidth up to 64 GHz in real-time or rather a data rate of 160 GSamples/s.

According to another embodiment, the signal acquisition circuit has four acquisition units and one trigger unit, wherein four inputs are provided. Thus, n=4 acquisition units, k=4 inputs as well as l=1 trigger unit are provided that form the signal acquisition circuit. This signal acquisition circuit ensures to process input signals with a bandwidth up to 128 GHz or rather a data rate of 320 GSamples/s.

In addition, each of the n acquisition units may be established on a separately formed chip. The separately formed chip may relate to an application-specific integrated circuit (ASIC) or a field-programmable gate array (FPGA), for example. Other analog and/or digital circuits, programmed processors, etc., may be also employed with embodiments of the present disclosure.

Furthermore, the signal acquisition circuit may relate to an interleaved acquisition system since the respective acquisition units processed interleaved input signals while the at least two acquisition units run time interleaved that are assigned to the inputs forming one channel.

Furthermore, embodiments of the present disclosure relate to a single-housed device comprising the signal acquisition circuit mentioned above. The respective single-housed device may be an oscilloscope or a spectrum analyzer, for example.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
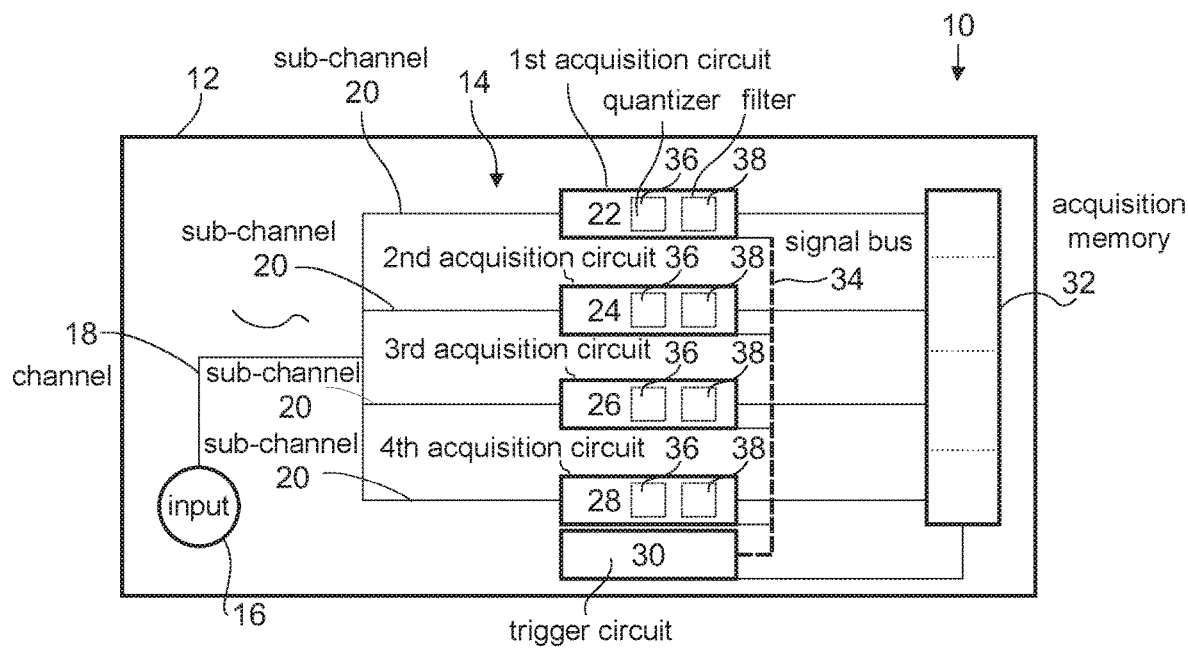
FIG. 1 shows a schematic overview of a single-housed device according to the present disclosure, which comprises a signal acquisition circuit according to the present disclosure.

In FIG. 1, a single-housed device 10 is shown that is a measurement device, for instance an oscilloscope or a spectrum analyzer. The single-housed device 10 has a housing 12 that encompasses a signal acquisition circuit 14 that is assigned to at least one signal input 16 of the single-housed device 10, which is located at a front end of the device 10. In the shown embodiment, the device 10 comprises two different signal inputs 16 for receiving signals with different bandwidths.

The single-housed device 10 and, therefore, the signal acquisition circuit 14 receives an input signal via at least one of the signal inputs 16. The input signal inputted via the respective signal input 16 is processed internally by the signal acquisition circuit 14 that relates to an interleaved acquisition system as will be described later. Generally, the input signal may have a bandwidth up to 128 GHz.

In the shown embodiment, the signal input 16 used is assigned to a (single) channel 18, for example an analog channel, that is enabled to process signals up to a data rate of 320 GSamples per second.

As mentioned above, the signal acquisition circuit 14 relates to an interleaved acquisition system. Hence, the channel 18 is connected with or rather split into four sub-channels 20 for acquiring data from the high bandwidth input signal in an interleaved manner. For example, each of the sub-channels 20 receives different samples of the high bandwidth input signal, namely every fourth sample of the input signal inputted via the respective signal input 16.

Accordingly, the first sub-channel 20 receives the samples with the indices 0, 4, 8 and so on, whereas the second sub-channel 20 receives the samples with the indices 1, 5, 9 and so on. In a similar manner, the third sub-channel 20 receives the samples with the indices 2, 6, 10 and so on, whereas the fourths sub-channel 20 receives the samples with the indices 3, 7, 11 and so on.

For acquiring the respective samples processed by the different sub-channels 20, the signal acquisition circuit 14, namely the interleaved acquisition system, comprises a first acquisition unit 22, a second acquisition unit 24, a third acquisition unit 26 and a fourth acquisition unit 28, wherein each of the acquisition units 22-28 is assigned to a respective sub-channel 20.

In the shown embodiment, each of the acquisition units 22-28 has an input 29 that is assigned to the respective sub-channel 20. The acquisition units 22-28 receive the respective interleaved input signal processed by the respective sub-channel 20 via their respective input 29. Accordingly, all inputs 29 are assigned to the same channel 18, wherein the corresponding acquisition units 22-28 run time interleaved.

Furthermore, the signal acquisition circuit 14 comprises at least one trigger unit 30, wherein the number of the at least one trigger unit 30, labelled by l, is integer. For example, the number of the at least one trigger unit 30, namely l, is smaller than the number of the inputs 29, labelled by k. Alternatively or additionally, the number of the at least one trigger unit 30, namely l, is smaller than the number of the acquisition units 22-28, labelled by n.

In the shown embodiment, a single trigger unit 30 is provided wherein all of the acquisition units 22-28 are connected with the at least one trigger unit 30 as will be described later in more detail.

In some embodiments, each of the four sub-channels 20 may have a sample rate of 80 GS per second and a resolution of 12 Bit resulting in under-sampled interleaved input signals processed by the respective acquisition units 22-28.

The first acquisition unit 22 is assigned to an acquisition memory 32 in which the respective acquired samples can be stored for offline post-processing. The other acquisition units 24-28 may be assigned to the same acquisition memory 32 or rather a separate acquisition memory. In other words, each of the sub-channels 20 may be assigned to their own acquisition memories. Alternatively, the sub-channels 20 are assigned to the common acquisition memory 32 that is internally divided in memory portions.

As shown in FIG. 1, each of the acquisition units 22-28 is connected with the trigger unit 30 via a signal bus 34 such that data outputted by the respective acquisition units 22-28 is directly forwarded to the trigger unit 30. In other words, data is exchanged via the signal bus 34.

For example, the data exchanged relates to the respective interleaved input signals that were previously processed by the corresponding acquisition units 22-28. The previously processed interleaved input signals are forwarded to the single trigger unit 30 via the signal bus 34 wherein the single trigger unit 30 applies the respective trigger (scenario) on the different interleaved input signals previously processed by the different acquisition units 22-28.

In other words, the single trigger unit 30 is configured to apply a certain trigger (scenario) on the interleaved input signals processed by at least two different or rather separately formed acquisition units 22-28. Thus, the single trigger unit 30 interacts with two different or rather separately formed acquisition units 22-28.

Each of the acquisition units 22-28 may have a quantizer 36 and/or a filter 38 for quantizing and/or filtering the interleaved input signals received via their inputs 29 while processing the respective interleaved input signals. Accordingly, each of the acquisition units 22-28 may output a pre-filtered and/or quantized interleaved input signal that is forwarded via the signal bus 34 towards the single trigger unit 30.

In general, the single trigger unit 30 may be implemented on a single chip separately formed with respect to the acquisition units 22-28. Alternatively, the single trigger unit 30 may be provided on a common chip with one of the acquisition units 22-28. However, each of the acquisition units 22-28 is implemented on a separately formed chip.

The respective chips may be established by an application-specific integrated circuit (ASIC) or rather a field-programmable gate array (FPGA). Other analog or digital circuits, programmed processors, etc., may be also employed to carry out its functionality.

Figure 2:
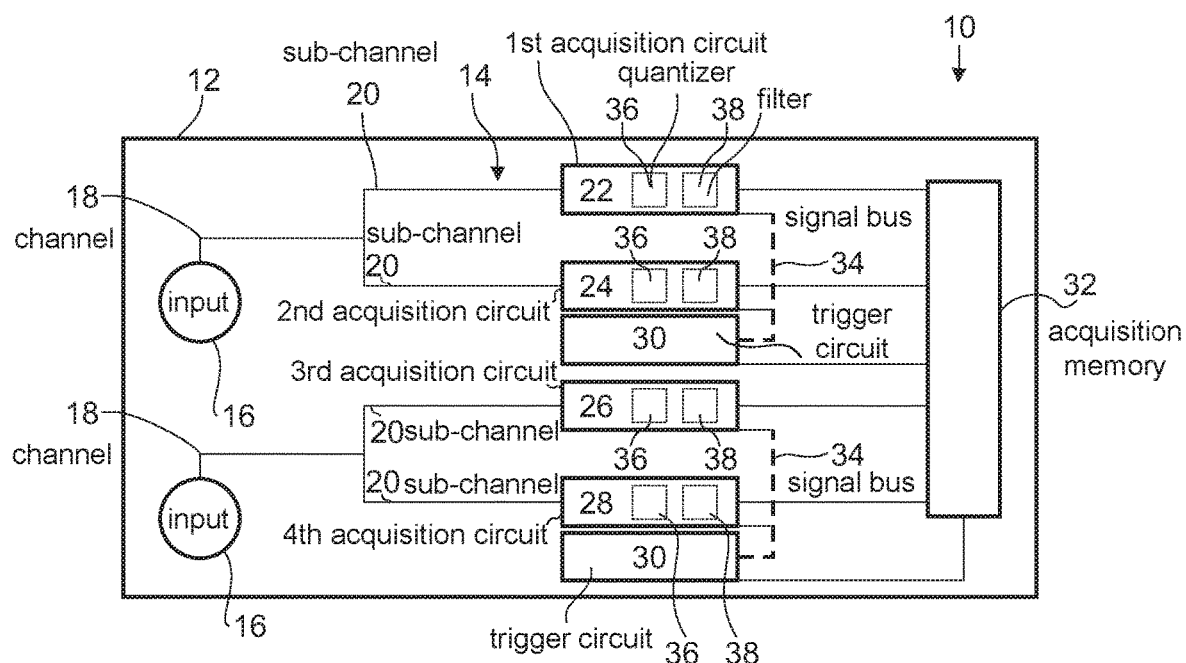
FIG. 2 shows an example of a signal acquisition circuit according to another embodiment.

In FIG. 2, another embodiment of the signal acquisition circuit 14 is shown that comprises two (analog) channels 18 assigned to two different signal inputs 16 of the single-housed device 10. The channels 18 are each assigned to two acquisition units 22-28. Thus, one channel 18 is assigned to two different acquisition units 22-28 wherein one trigger unit 30 is provided per analog channel 18.

The signal acquisition circuit 14 according to the embodiment of FIG. 2 is configured to process input signals with a bandwidth up to 64 GHz per channel 18 while the input signals having a sample rate of 160 GSamples per second.

In a similar manner to the embodiment shown in FIG. 1, the first acquisition unit 22, 26 of each channel 18 forwards a previously processed interleaved input signal to the respective trigger unit 30 that is assigned to the other acquisition unit 24, 28 of the respective channel 18, particularly the second acquisition unit 24, 28.

The embodiments of the signal acquisition circuit 14 shown in FIG. 1 and FIG. 2 differ from each other in the number of acquisition units and inputs of the respective signal acquisition circuit per channel 18. However, two inputs of the acquisition units together form one analog channel 18 wherein the respective acquisition units run time interleaved. Further, the number of the at least one trigger unit 30 is smaller than the number of the inputs of the acquisition units. Accordingly, the inputs 29 of two acquisition units 22-28 are assigned to a common channel 18, wherein the corresponding acquisition units 22-28 run time interleaved.

Similar to the embodiment shown in FIG. 1, each of the acquisition units 22-28 comprises the quantizer 36 and/or the filter 38 for quantizing and/or filtering the interleaved input signals received via their inputs 29 while processing the respective interleaved input signals.

Accordingly, each of the acquisition units 22-28 may output a pre-filtered and/or quantized interleaved input signal that is forwarded via the signal bus 34 towards the single trigger unit 30 of the respective channel 18.

Figure 3:
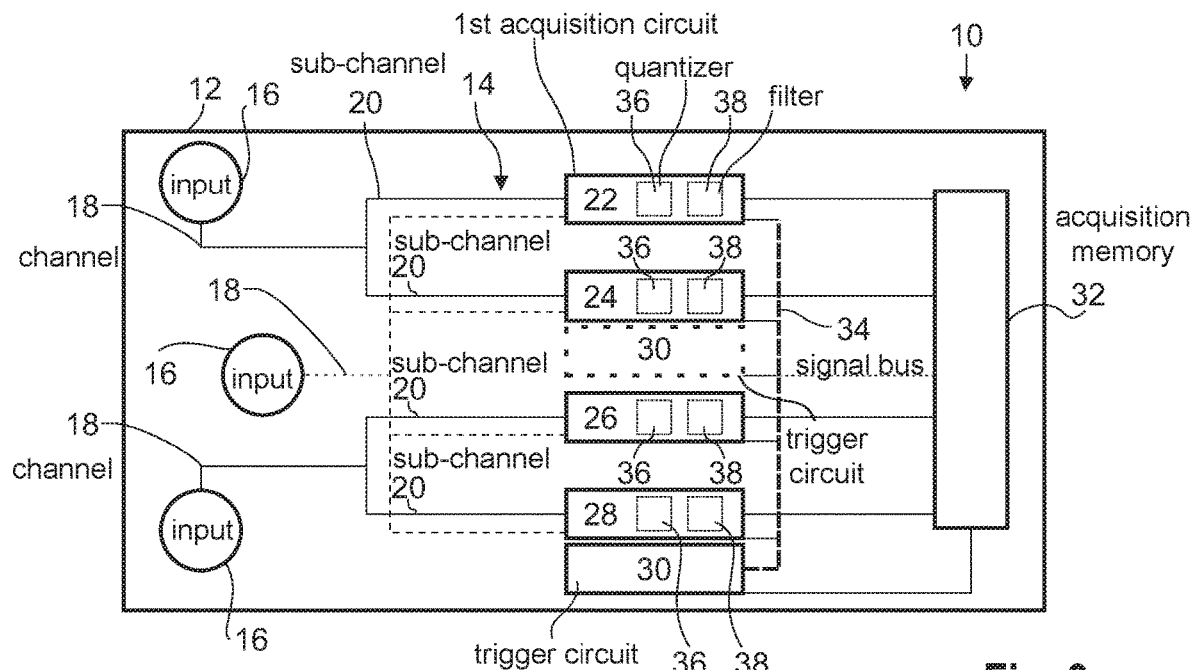
FIG. 3 shows an example of a signal acquisition circuit according to a further embodiment.
Figure 4:
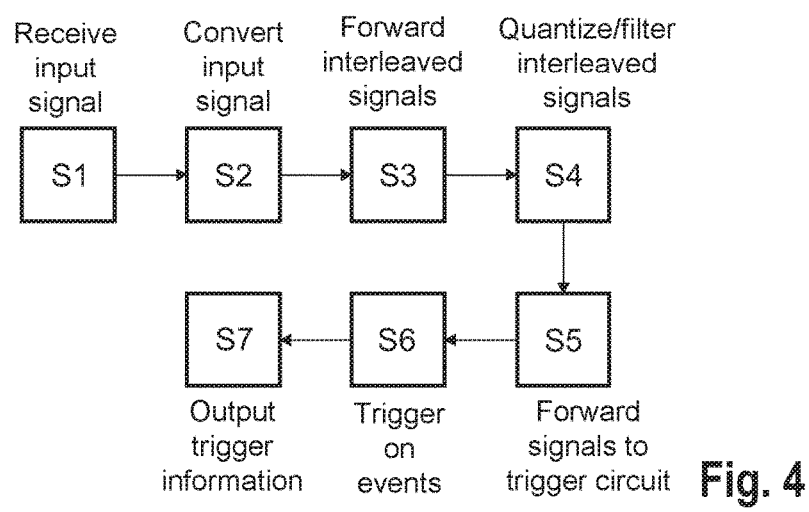
FIG. 4 shows a flow-chart illustrating a method of acquiring data of an input signal according to the present disclosure.

In FIG. 3, another embodiment is shown according to which each of the acquisition units 22-28 has at least two inputs 29 that are assigned to different (analog) channels 18 of the signal acquisition circuit 14. Put differently, each of the acquisition units 22-28 is assigned to at least two different signal inputs 16 yielding different configurations.

In the shown embodiment, the signal acquisition circuit 14 also comprises four acquisition units 22-28. The acquisition units 22-28 or rather the respective chips are generally configured to process input signals with a bandwidth up to 128 GHz per channel 18 as well as a sample rate of 320 GSamples per second per channel 18.

However, the same signal acquisition circuit 14 is also configured to process two different signals via two different channels 18 wherein the different signals may have a bandwidth up to 64 GHz per channel 18 while providing a sample rate of 160 GS per second per channel 18. This depends, for example, on the respective signal input 16 used for forwarding the input signal(s) to the signal acquisition circuit 14.

As shown in FIG. 3, one of the signal inputs 16 is assigned to a channel 18 that splits into four sub-channels 20 similar to the embodiment shown in FIG. 1. This single channel 18 is enabled to process input signals with a bandwidth up to 128 GHz or rather a sample rate of 320 GSamples per second.

However, the other two signal inputs 16 are each assigned to a respective channel 18 that only splits into two sub-channels 20 similar to the embodiment shown in FIG. 2. These single channels 18 each are enabled to process input signals with a bandwidth up to 64 GHz or rather a sample rate of 160 GSamples per second.

Accordingly, the embodiment shown in FIG. 3 relates to a mixture of the embodiments shown in FIGS. 1 and 2 wherein each of the each of the acquisition units 22-28 has at least two inputs 29 that are assigned to different channels 18 of the signal acquisition circuit 14.

Should the operator of the device 10 shown in FIG. 3 select the signal input 16 assigned to the single channel 18 interacting with all acquisition units 22-28, namely the one illustrated by dashed lines, one of the generally two trigger units 30 may be deactivated as illustrated by the dashed lines in FIG. 3. The respective signal input 16 may relate to a signal input enabled to process input signals with a bandwidth up to 128 GHz whereas the other both signal inputs 16 shown are only enabled to process input signals with a bandwidth up to 64 GHz.

Hence, all acquisition units 22-28 forward their respective previously processed interleaved input signals via the signal bus 36 to the single trigger unit 30, namely the quantized and/or filtered interleaved input signals.

Generally, the signal acquisition circuit 14 of all embodiments shown previously is configured to perform a method of acquiring data of the input signal inputted into one of the respective signal inputs 16.

In a first step S1, the input signal inputted is received via the corresponding channel 18. The input signal may have a bandwidth up to 128 GHz.

In a second step S2, the input signal is converted by one or more time interleaved analog-to-digital converters ADCs into interleaved input signals. This step relates to the interleaving of the input signal.

In a third step S3, the interleaved input signals are forwarded to and received by the corresponding acquisition units 22-28 that also run time interleaved.

In a fourth step S4, the acquisition units 22-28, particularly integrated quantizers 36 and/or filters 38, quantize and/or filter each interleaved input signal respectively in order to obtain quantized and/or filtered interleaved input signals.

In a fifth step S5, the quantized and/or filtered interleaved input signals are forwarded to the trigger unit 30 via the signal bus 34.

In a sixth step S6, the trigger unit 30 triggers on events in the de-interleaved quantized and/or filtered input signal received via the signal bus 34. Hence, the trigger unit 30 may apply complex trigger scenarios on the input signal received.

In a seventh step S7, trigger information is outputted.

Accordingly, the signal acquisition circuit 14 as well as the method ensure that input signals with a high bandwidth can be processed in an appropriate manner without any limitation concerning the bandwidth and without discarding any signal edges due to the interleaved signal acquisition system provided.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal acquisition circuit for acquiring data of an input signal, said signal acquisition circuit comprising:
    at least N acquisition circuits, wherein N is an integer greater than one, said N acquisition circuits comprising K inputs, wherein K is an integer greater than one, and wherein at least two inputs are assigned to one channel and the corresponding acquisition circuits run time interleaved, and
    wherein the signal acquisition circuit comprises only one trigger circuit, wherein the only one trigger circuit is a common trigger circuit,
    wherein at least two of the N acquisition circuits are operated in parallel, wherein the at least two acquisition circuits operated in parallel share the common trigger circuit such that data outputted by the respective acquisition circuits is directly forwarded to the common trigger circuit that applies a respective trigger on the data outputted by the respective acquisition circuits, and wherein the common trigger circuit is implemented on a single chip,
    wherein said signal acquisition circuit further comprises a signal bus connecting each of said N acquisition circuits with said only one trigger circuit such that data outputted by the N acquisition circuits is directly forwarded to said only one trigger circuit.

2. The signal acquisition circuit according to claim 1, wherein each of said N acquisition circuits has at least one input.

3. The signal acquisition circuit according to claim 1, wherein each of said N acquisition circuits has at least two inputs that are assigned to different channels of said signal acquisition circuit.

4. The signal acquisition circuit according to claim 1, wherein each channel has a maximum sampling rate, and wherein the maximum sampling rate divided by the number of inputs is constant.

5. The signal acquisition circuit according to claim 1, wherein said signal acquisition circuit further comprises a signal bus connecting each of said N acquisition circuits with said at least one trigger circuit.

6. The signal acquisition circuit according to claim 1, wherein at least one of said n acquisition circuits comprises a quantizer configured to quantize a K-th input signal and to output a quantized input signal.

7. The signal acquisition circuit according to claim 5, wherein at least one of said n acquisition circuits comprises a quantizer configured to quantize a K-th input signal and to output a quantized input signal, and wherein said signal bus communicates said quantized input signal.

8. The signal acquisition circuit according to claim 1, wherein said signal acquisition circuit further comprises at least one filter.

9. The signal acquisition circuit according to claim 8, wherein said at least one filter is provided in one of said N acquisition circuits.

10. The signal acquisition circuit according to claim 1, wherein said signal acquisition circuit has two acquisition circuits and one trigger circuit, and wherein two inputs are provided.

11. The signal acquisition circuit according to claim 1, wherein said signal acquisition circuit has four acquisition circuits and one trigger circuit, and wherein four inputs are provided.

12. The signal acquisition circuit according to claim 1, wherein each of said N acquisition circuits is established on a separately formed chip.

13. The signal acquisition circuit according to claim 1, wherein the signal acquisition circuit relates to an interleaved acquisition system.

14. A single-housed device comprising the signal acquisition circuit according to claim 1.

15. A signal acquisition circuit for acquiring data of an input signal, said signal acquisition circuit comprising:
    at least N acquisition circuits, wherein N is an integer greater than one, said N acquisition circuits comprising K inputs, wherein K is an integer greater than one, and wherein at least two inputs are assigned to one channel and the corresponding acquisition circuits run time interleaved, and wherein the signal acquisition circuit comprises only one trigger circuit wherein the only one trigger circuit is a common trigger circuit, wherein the N acquisition circuits are operated in parallel, and wherein the N acquisition circuits operated in parallel share the common trigger circuit that applies a respective trigger on data outputted by the respective acquisition circuits, and wherein the common trigger circuit is implemented on a single chip, wherein said signal acquisition circuit further comprises a signal bus connecting each of said N acquisition circuits with said only one trigger circuit such that data outputted by the N acquisition circuits is directly forwarded to said only one trigger circuit.

* * * * *